(12) United States Patent
Ham et al.

(10) Patent No.: US 7,292,036 B2
(45) Date of Patent: Nov. 6, 2007

(54) MRI SYSTEM HAVING REDUCED ACOUSTIC NOISE

(75) Inventors: Cornelis Leonardus Gerardus Ham, Eindhoven (NL); Hans Tuithof, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/595,580

(22) PCT Filed: Oct. 21, 2004

(86) PCT No.: PCT/IB2004/052167

§ 371 (c)(1),
(2), (4) Date: Apr. 28, 2006

(87) PCT Pub. No.: WO2005/045454

PCT Pub. Date: May 19, 2005

(65) Prior Publication Data

US 2007/0085542 A1   Apr. 19, 2007

(30) Foreign Application Priority Data

Nov. 5, 2003   (EP)   ................... 03104079

(51) Int. Cl.
*G01V 3/00* (2006.01)

(52) U.S. Cl. ...................... 324/318; 324/322
(58) Field of Classification Search ............... 324/318, 324/322

See application file for complete search history.

(56) References Cited

U.S. PATENT DOCUMENTS

| 4,774,486 | A |  | 9/1988 | Moritsu |
| 5,235,283 | A |  | 8/1993 | Lehne et al. |
| 5,256,969 | A |  | 10/1993 | Miyajima et al. |
| 5,345,177 | A |  | 9/1994 | Sato et al. |
| 5,572,131 | A |  | 11/1996 | Rzedzian |
| 6,147,494 | A |  | 11/2000 | Ham |
| 6,294,972 | B1 | * | 9/2001 | Jesmanowicz et al. ...... 335/301 |
| 6,441,614 | B1 | * | 8/2002 | Edelstein et al. ........... 324/318 |
| 6,462,547 | B1 |  | 10/2002 | Heid et al. |
| 6,564,900 | B1 |  | 5/2003 | Dean et al. |
| 2002/0121956 | A1 |  | 9/2002 | Kuth |
| 2003/0006773 | A1 |  | 1/2003 | Ries |

FOREIGN PATENT DOCUMENTS

| DE | 19856802 A1 | 8/2000 |
| JP | 3212261 A | 9/1991 |

* cited by examiner

*Primary Examiner*—Louis M. Arana

(57) ABSTRACT

A magnetic resonance imaging (MRI) system includes a gradient coil system. The gradient coil system comprises an inner coil configuration (1,2,3) and an outer coil configuration (4,5,6) positioned substantially coaxially with said inner coil configuration (1,2,3). Both coil configurations are attached to a tubular body (7) located between said two coil configurations (1,2,3,4,5,6) and extend substantially coaxially with both of the coil configurations. The tubular body (7) comprises stainless steel rods (10) positioned substantially in an axial direction.

18 Claims, 5 Drawing Sheets

MRI SYSTEM HAVING REDUCED ACOUSTIC NOISE

The invention relates to a magnetic resonance imaging (MRI) system including a gradient coil system comprising an inner coil configuration and an outer coil configuration that is positioned substantially coaxially with said inner coil configuration, both coil configurations being attached to a tubular body located between said two coil configurations and extending substantially coaxially with both said coil configurations.

In such a system the tubular body has two functions. On the one hand it connects the two coil configurations to form a rigid tubular gradient coil system, and on the other hand it keeps the inner coil configuration at the required distance from the outer coil configuration. The complete gradient coil system has a substantially tubular shape and encloses the measuring space of the MRI system.

U.S. Pat. No. 6,147,494 discloses such an MRI system, comprising a superconductive coil system for generating a steady magnetic field in the Z-direction, i.e. the axial direction, of a measuring space of the apparatus, wherein the gradient coil system is arranged within said superconductive coil system. The gradient coil system also serves to generate a magnetic field in the measuring space of the apparatus. The inner coil configuration generates a gradient field and the outer coil configuration is an enclosing shielding coil for shielding the environment from the gradient field generated by the inner coil configuration. Between the inner coil configuration and the outer coil configuration there is a tubular body connecting said two coil configurations. The tubular body is made from synthetic material such as fiberglass-reinforced epoxy.

During operation of such an MRI system, acoustic noise is generated because of vibrations in parts of the system. These vibrations are caused by changing (alternating) Lorentz forces exerted on the different parts of the system. Such noise is unpleasant for the person lying in the system as well as for the operators of the system. Although many attempts have been made to decrease the level of noise generated by the MRI system in operation, there is still an annoying noise level in the existing systems.

The object of the invention is to decrease the noise level during operation of the MRI system considerably.

In order to accomplish that objective, said tubular body between said inner coil figuration and said outer coil figuration comprises stainless steel rods which are positioned substantially in axial direction of the tubular body. Such stainless steel rods reduce the flexibility of the tubular body. Especially, it increases the resistance to bending of the tubular body. The rods may have any dimension, but their cross-section should not be too large to avoid excessive eddy currents. The stainless steel rods may be embedded in the material of the tubular body, which is, for example, epoxy comprising glass spheres and/or epoxy-reinforced with fiberglass.

The expression "stainless steel rod" covers any oblong piece or assembly of stainless steel, also, for example, a stainless steel cable.

It was found in practice that vibrations in the system can be considerably reduced by increasing the resistance of the tubular body to bending, and that such resistance can be effectively obtained by application of said stainless steel rods in the material of the tubular body.

Preferably, the stainless steel rods are present in the central portion of the tubular body, i.e. near the radial plane in the middle of the tubular body. In that location the forces in axial direction in the material of the tubular body are relatively large, which forces tend to bend the tubular body. Therefore it is effective to reinforce the tubular body especially in that location.

In one preferred embodiment, the stainless steel rods extend substantially over the entire length of said tubular body, providing a reinforcement of the whole tubular body. Preferably, the stainless steel rods are connected to each other at both ends of each rod. The rods are thus effectively attached to each other so as to form an assembly of rods, in order to obtain a correct mutual positioning of the rods in the material of the tubular body.

In one preferred embodiment, said tubular body comprises a stainless steel cylindrical wall having axial slits to form the axially directed rods. After a stainless steel cylindrical wall has been formed, the wall may be provided with axially directed slits in a material-removing operation, for example by means of a laser beam, in order to form the assembly of stainless steel rods.

In another preferred embodiment, said stainless steel rods are strips positioned substantially in a cylindrical surface. The expression "strip" denotes a rod having a rectangular cross-section, the longer side being much longer than the relatively small shorter side. The shorter side may be between 0.5 mm and 3 mm, preferably between 1 mm and 2 mm. The longer side of the rectangular shape of said cross-section may be between 5 mm and 40 mm, preferably between 10 mm and 25 mm.

To form the cylindrical surface from strips (in fact a cylindrical wall, wherein the strips may overlap each other), a plate-like element may be wound into a spiral shape by means of a mandrel in order to form the cylindrical wall, said plate-like element then comprising substantially parallel stainless steel strips, which stainless strips extend in a substantially axial direction after the cylindrical surface has been formed. The cylindrical wall is composed of one or more layers of the plate-like element, such that the turns of the plate-like element are electrically insulated from each other. In order to achieve such insulation, a layer of insulating material may be present between the turns of the plate-like element. The insulation may also be obtained in that the plate-like element is composed of two layers, i.e. a layer of insulating material and a layer comprising the stainless steel strips. Furthermore, the space between the strips in the plate-like element may be filled up with electrically insulating material.

In one preferred embodiment, at least some of said rods comprise cooling channels for guiding a cooling fluid. If the gradient coil system has to be cooled by means of a cooling medium, for example water, it is efficient to accommodate cooling channels in the stainless steel rods, because stainless steel is a good material for guiding heat.

In one preferred embodiment, at least some of said rods comprise an axially extending space accommodating pieces of shim iron. Such pieces of iron may be mounted on a plastic shim rail, and the shim rail may be shifted into said space. The pieces of shim iron serve to achieve further homogenization of the steady magnetic field which is generated by a coil system surrounding the gradient coil system.

The invention will now be further elucidated by means of a description of some embodiments of a gradient coil system of a MRI system, for which reference is made to the drawing comprising Figures which are merely schematic representations, in which.

Corresponding parts are indicated with the same reference numerals in the various embodiments.

Figure 1:
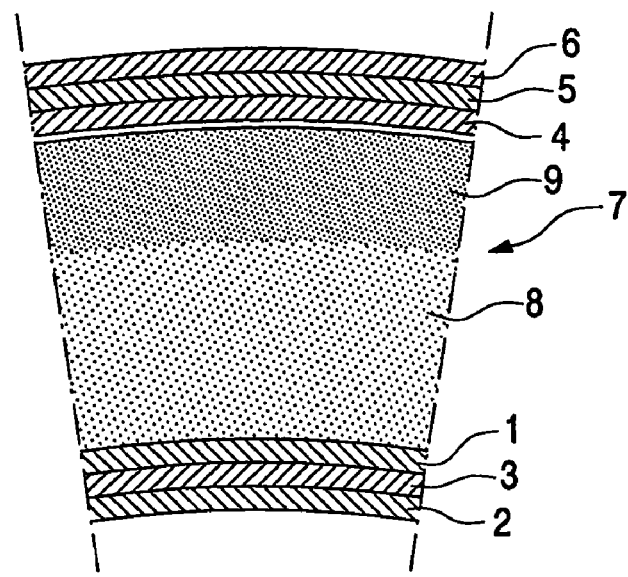
FIG. 1 is a portion of a sectional view of a gradient coil system according to the prior art.

FIG. 1 shows a portion of a sectional view of a gradient coil system forming part of a MRI system according to the invention. The other parts of the MRI system are not shown in the Figures, as these parts are all well known to those skilled in the art. The complete gradient coil system has a substantially tubular shape, and its dimension is such that a person, or at least the main portion of a person, can be accommodated inside the tubular system (in the measuring space), so that the human body, or a part of the human body, can be investigated by the system. A sectional view in a radial plane has an annular shape. A portion of that annular shape is represented in FIG. 1, and also in the FIGS. 2, 5, 7, 8, 9 and 10. In fact, such a portion of the sectional view represents the configuration of the complete gradient coil system. In general, the system is located in a superconductive coil system that generates a steady magnetic field in said measuring space in the Z-direction (axial direction) of the tubular gradient coil system. The gradient coil system provides a gradient of the magnetic field in certain directions.

According to FIG. 1, an inner coil configuration comprises three layers 1,2,3 located at the inner side of the gradient coil system. Each layer comprises coils for generating a magnetic field gradient in a certain direction. Layer 1 generates a magnetic gradient in the Z-direction, i.e. the axial direction of the tubular gradient coil system. Layer 2 generates a magnetic gradient in the X-direction, i.e. a radial direction perpendicular to the Z-direction, and layer 3 generates a magnetic gradient in the Y-direction, i.e. the direction perpendicular to the X-direction and as perpendicular to the Z-direction. Therefore, layer 1 comprises coils substantially in radial planes, so that the coils run around the measuring space in the tubular gradient coil system. Layers 2 and 3 comprise saddle-shaped coils. Such a saddle-shaped coil extends in the layer 2 and in the layer 3 at one side of a plane through the axis of the tubular gradient coil system.

The outer coil configuration is located at the outer side of the gradient coil system and also comprises three layers 4,5,6. Layer 4 comprises coils for generating a magnetic field gradient in the Z-direction, which coils are located substantially in radial planes, like the coils in layer 1 of the inner coil configuration. Layers 5 and 6 comprise saddle-like coils to generate magnetic field gradients in the X-direction and the Y-direction, respectively.

As is shown in FIG. 1, a tubular body 7 is present between the inner coil configuration 1,2,3 and the outer coil configuration 4,5,6. The material of the tubular body 7 is epoxy resin containing glass. At the inner side 8 the epoxy resin contains glass spheres as a filler, and at the outer side 9 the epoxy resin is reinforced by glass fibers. The tubular body 7 connects the inner coil configuration 1,2,3 to the outer coil configuration 4,5,6, and furthermore the tubular body 7 keeps the two coil configurations 1,2,3 and 4,5,6 at the required distance from each other.

Figure 2:
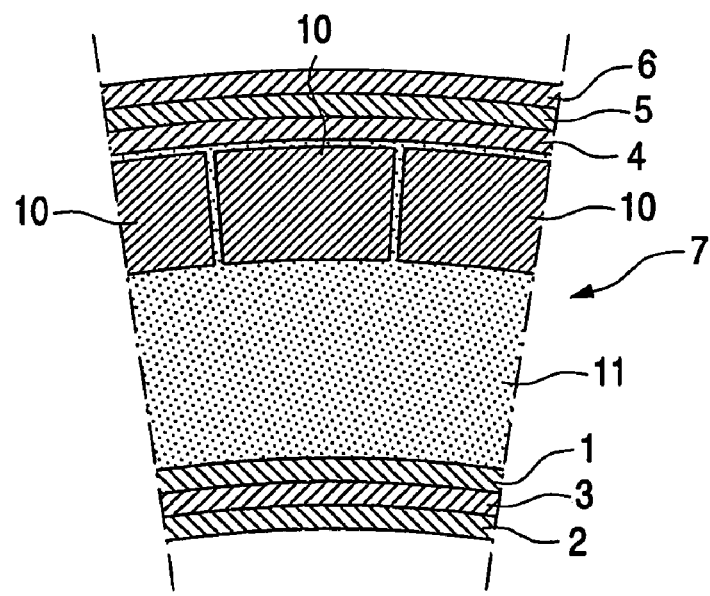
FIG. 2 is a corresponding view showing a first embodiment of a gradient coil system according to the invention.

FIG. 2 shows a first embodiment of the gradient coil system according to the invention, where the tubular body 7 comprises stainless steel rods 10, of substantially rectangular cross-section. The stainless steel rods 10 are located at the outer side of the tubular body 7 (near the outer coil configuration 4,5,6), but the rods 10 may alternatively be located at the inner side (near the inner coil configuration 1,2,3) or somewhere in the middle area. The remainder of the tubular body 7 comprises epoxy resin with glass spheres referenced 11. This material is also present between the stainless steel rods 10.

Figure 3:
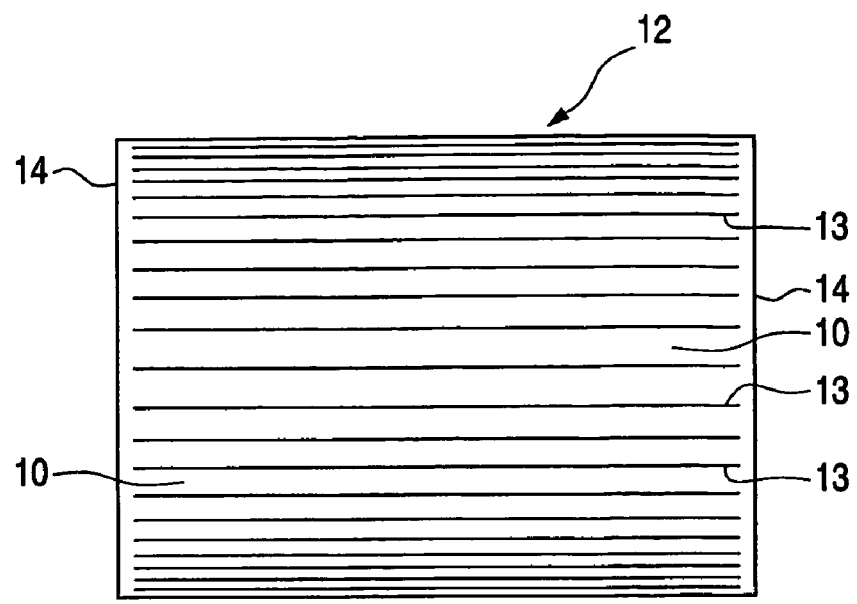
FIG. 3 is a side view of an assembly of rods as applied in the first embodiment.
Figure 4:
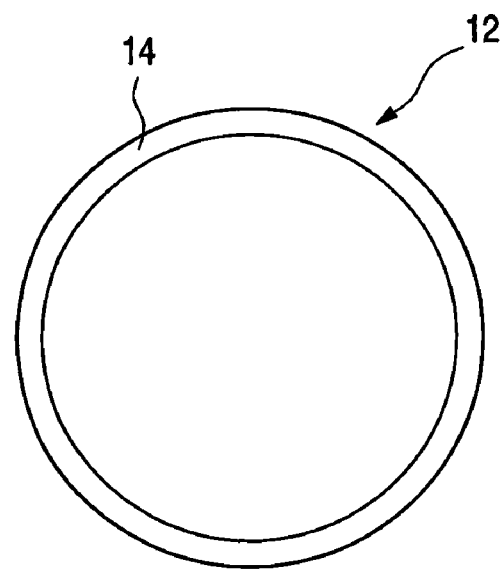
FIG. 4 is a front view of the assembly of rods shown in FIG. 3.

FIG. 3 shows a stainless steel cylindrical wall 12 in side view, and FIG. 4 shows the same cylindrical wall 12 in front view, i.e. in axial direction. In this example of an embodiment, the thickness of the cylindrical wall 12 is about 10 mm, the length is about 1.2 m, and its diameter is about 50 cm. The cylindrical wall 12 is provided with slits 13 in axial direction. The distance between the slits 13 is about 15 mm. Each slit 13 has a width of about 1 mm and extends in a plane through the axial axis of the cylindrical wall 12. The slits 13 terminate at a short distance from the edge 14 of the cylindrical wall 12.

The cylindrical wall 12 provided with slits 13 as shown in FIGS. 3 and 4 form an assembly of parallel stainless steel rods 10, wherein a rod 10 is present between each pair of neighboring slits 13. The assembly of rods 10 is used to produce the first embodiment of the gradient coil system as shown in FIG. 2. The assembly of parallel rods 10, in which the rods are interconnected at both ends, i.e. near the edge 14, forms a stable framework of the tubular body 7. After it has been placed and positioned between the inner coil configuration 1,2,3 and the outer coil configuration 4,5,6, the epoxy resin 11 containing glass spheres can be applied, so that a solid and stiff tubular gradient coil system is obtained.

Figure 5:
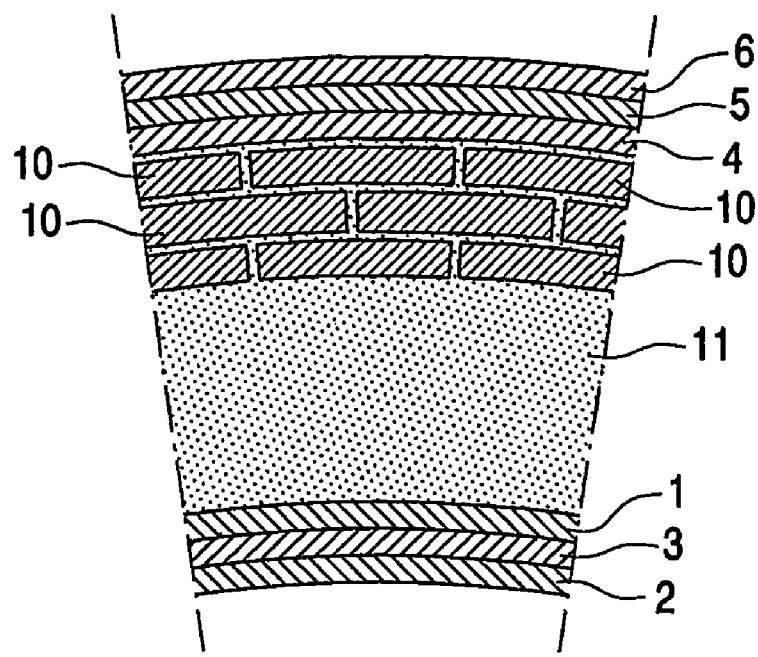
FIG. 5 shows a second embodiment of a gradient coil system.

FIG. 5 shows a second embodiment of the gradient coil system. In this embodiment the stainless steel rods 10 are strips, the longer side of the rectangular cross-section of each rod 10 being much longer than the shorter side. The stainless steel rods 10 are arranged in three layers, and electrically insulating material is present between the rods 10, which material may be epoxy resin, which may contain glass spheres.

Figure 6:
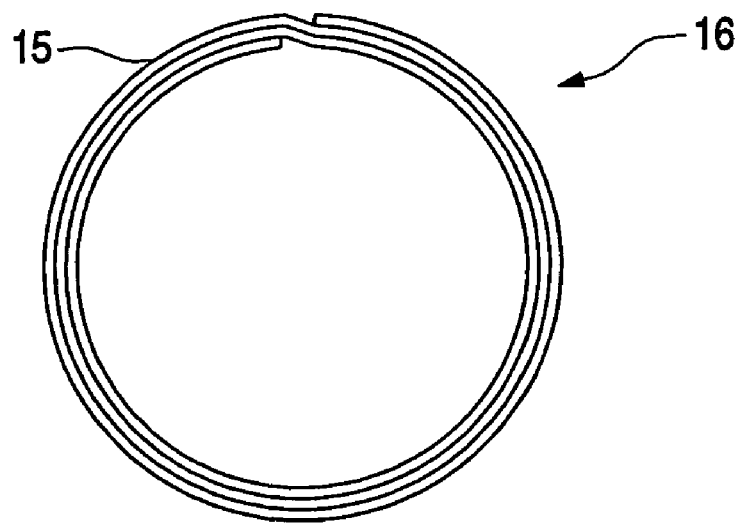
FIG. 6 shows a wound plate-like element.

The assembly of strip-like stainless steel rods 10 comprising the three layers of rods 10 may be manufactured by winding a plate-like element 15 around a mandrel in order to form a spiraling cylindrical wall 16, as is shown in FIG. 6. The plate-like element 15 then comprises stainless steel strips in a direction perpendicular to the direction of bending of the plate-like element 15. The strips may be interconnected at their ends, in order to ensure a correct parallel positioning of the strips.

The space between the strips in the plate-like element 15 may be filled up with insulating material. Furthermore, the plate-like element 15 may be provided with a layer of insulating material at one side, so that the insulating material is present between the strips—or rods 10—after the plate-like element has been wound so as to form the cylindrical wall 16. In the second embodiment shown in FIG. 5, there are three layers of strip-like stainless steel rods 10, but the number of layers may be much higher.

Figure 7:
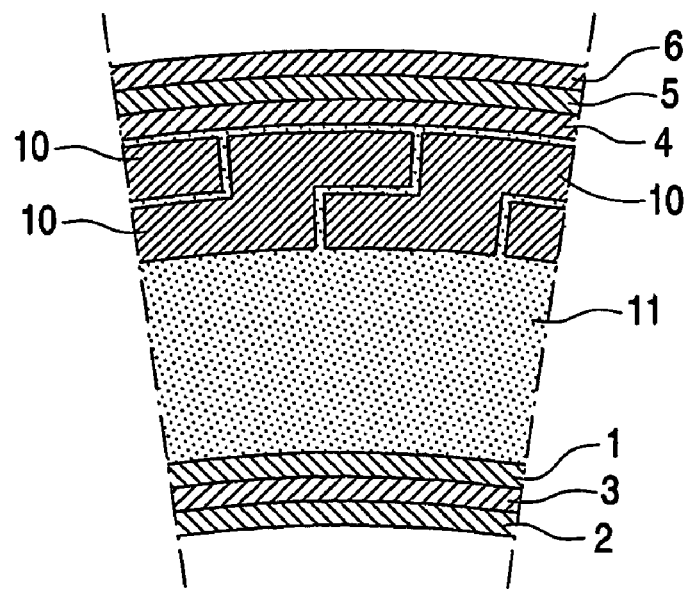
FIG. 7 shows a third embodiment of a gradient coil system.

FIG. 7 shows a third embodiment of a gradient coil system, wherein the stainless steel rods 10 have a Z-shaped cross section. The rods 10 are arranged in a stacking position, overlapping each other partly. Such a configuration of the stainless steel rods 10 provides a very stable assembly of rods 10.

Figure 8:
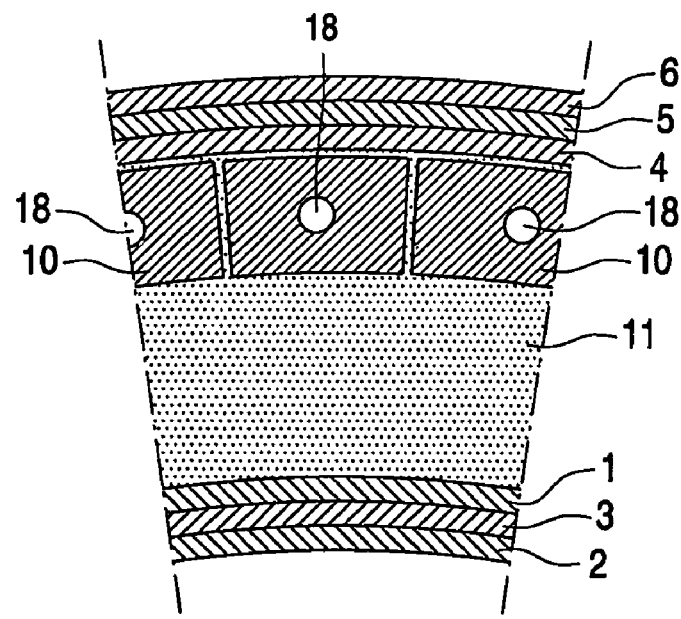
FIG. 8 shows a fourth embodiment of a gradient coil system.

FIG. 8 shows a fourth embodiment, wherein the stainless steel rods 10 are provided with a cooling channel 18 for guiding a cooling fluid like water. Since the material of the rods 10 is a good thermal conductor, an efficient heat transfer to the cooling fluid is ensured.

Figure 9:
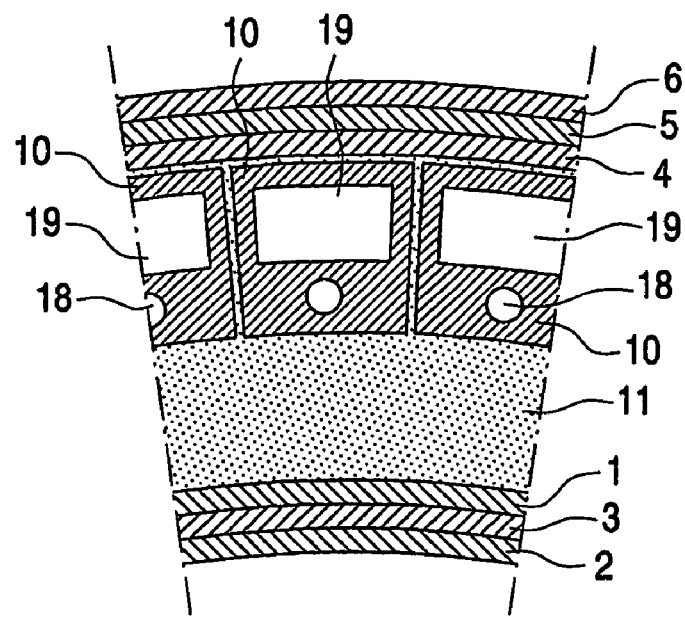
FIG. 9 shows a fifth embodiment of a gradient coil system.

In the fifth embodiment of the gradient coil system shown in FIG. 9, there is not only a cooling channel 18 in the stainless steel rods 10, but also a space 19 for accommodating a shim rail. The shim rail is not shown in the Figure because it is a known device. It is a plastic rail, and pieces of iron can be attached to it. The presence of the pieces serves to achieve a homogenization of the steady magnetic field which is generated by a coil system surrounding the gradient coil system.

Figure 10:
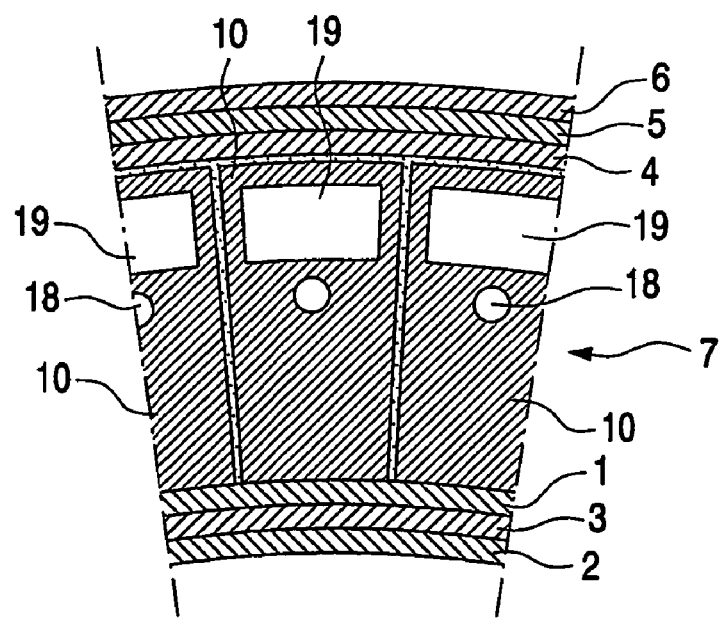
FIG. 10 shows a sixth embodiment of a gradient coil system.

FIG. 10 shows a sixth embodiment corresponding to the embodiment shown in FIG. 9; however, the stainless steel rods 10 containing the cooling channels 18 and the space 19 for the shim rail now, extend over a major portion of the tubular body 7. The stainless steel rods 10 are thus located near both gradient coil configurations 1,2,3 and 4,5,6, with the result that both configurations are effectively cooled.

The invention has been described with reference to the preferred embodiment. Obviously, modifications and alterations will occur to others upon reading the understanding this specification. It is intended to include all such modifications and alterations insofar as they come within the scope of the appended claims or the equivalence thereof.

The invention claimed is:

1. A magnetic resonance imaging system including a gradient coil system comprising:
   an inner coil configuration and an outer coil configuration that is positioned substantially coaxially with said inner coil configuration, both coil configurations being attached to a tubular body located between said two coil configurations and extending substantially coaxially with both said coil configurations, wherein said tubular body comprises stainless steel rods which are positioned substantial in axial direction, at least some of said rods comprising cooling channels for guiding a cooling medium.

2. A system as claimed in claim 1, wherein stainless steel rods extend substantially over the entire length of said tubular body.

3. A system as claimed in claim 2, wherein said stainless steel rods are connected to each other at both ends of each rod.

4. A system as claimed in claim 1, wherein said tubular body comprises a stainless steel cylindrical wall having axial slits.

5. A system as claimed in claim 1, wherein said stainless steel rods include strips positioned substantially in a cylindrical plane.

6. A system as claimed in claim 1, wherein a plate-like element is wound into a spiral shape in order to form a cylindrical wall, such that said plate-like element comprises substantially parallel stainless steel strips, the stainless steel strips extending in substantially axial direction after the cylindrical wall has been formed.

7. A system as claimed in claim 1, wherein at least some of said rods comprise an axially extending space for accommodating pieces of shim iron.

8. A magnetic resonance imaging system including a gradient coil system comprising:
   a tubular body including:
      a pair of stainless steel end rings;
      a plurality of stainless steel rods extending axially and connected with the end rings;
      a reinforced polymer disposal between and enclosing the stainless steel rods and end rings;
   at least one outer gradient coil disposed on an outer surface of the tubular body; and
   at least on inner gradient coil disposed on an inner surface of the tubular body.

9. The system as claimed in claim 8, wherein at least some of the stainless steel rods define passages for cooling fluid extending therein.

10. The system as claimed in claim 8, wherein at least some of the stainless steel rods define passages configured to accommodate shim iron.

11. The system as claimed in claim 8, wherein the rods have a z-shaped cross section and are arranged in a stacking position at least partially overlapping each other.

12. The system as claimed in claim 8, wherein the stainless steel rods and the stainless steel end rings are a unitary construction.

13. A gradient coil system for a magnetic resonance imaging system comprising:
   a tubular body including:
      at least one stainless steel clement which defines a plurality of axially extending passages circumferentially distributed around the tubular body;
      the axially extending passages being configured to accommodate pieces of shim iron;
   at least one outer gradient coil disposed on an outer surface of the tubular body; and
   at least on inner gradient coil disposed on an inner surface of the tubular body.

14. The system as claimed in claim 13, further including a plurality of pieces of shim iron disposed in the axially extending passages.

15. The system as claimed in claim 13, wherein the at least one stainless steel element further defines cooling channels for guiding a cooling fluid through the tubular body.

16. The system as claimed in claim 13, wherein the at least one stainless steel element includes a plurality of stainless steel bars.

17. The system as claimed in claim 16, wherein the stainless steel bars are interconnected at their ends.

18. A system as claimed in claim 16, wherein stainless steel rods are present in the central portion of the tubular body.

* * * * *